（12） United States Patent
Cho et al.

(10) Patent No.: US 8,821,752 B2
(45) Date of Patent: Sep. 2, 2014

(54) ETCHING COMPOSITION AND METHOD FOR FABRICATING SEMICONDUCTOR DEVICE USING THE SAME

(71) Applicants: SK hynix Inc., Gyeonggi-do (KR); Soulbrain Co., Ltd., Gyeonggi-do (KR)

(72) Inventors: Sung-Hyuk Cho, Gyeonggi-do (KR); Kwon Hong, Gyeonggi-do (KR); Hyung-Soon Park, Gyeonggi-do (KR); Gyu-Hyun Kim, Gyeonggi-do (KR); Ji-Hye Han, Gyeonggi-do (KR); Jung-Hun Lim, Gyeonggi-do (KR); Jin-Uk Lee, Gyeonggi-do (KR); Jae-Wan Park, Gyeonggi-do (KR); Chan-Keun Jung, Gyeonggi-do (KR)

(73) Assignees: SK Hynix Inc., Gyeonggi-do (KR); Soulbrain Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/708,362

(22) Filed: Dec. 7, 2012

(65) Prior Publication Data

US 2013/0157427 A1 Jun. 20, 2013

(30) Foreign Application Priority Data

Dec. 16, 2011 (KR) .......................... 10-2011-0136430

(51) Int. Cl.
*C09K 13/00* (2006.01)

(52) U.S. Cl.
USPC ............. 252/79.1; 216/37; 216/67; 252/79.2; 252/79.3; 252/79.4

(58) Field of Classification Search
USPC ............................... 216/37, 67; 252/79.1–79.4
See application file for complete search history.

(56) References Cited

U.S. PATENT DOCUMENTS 6,268,456 B1 * 7/2001 Gregorovich et al. .......... 528/35

* cited by examiner

*Primary Examiner* — Nadine Norton
*Assistant Examiner* — Maki Angadi
(74) *Attorney, Agent, or Firm* — IP & T Group LLP

(57) ABSTRACT

The present invention provides an etching composition, comprising a silyl phosphate compound, phosphoric acid and deionized water, and a method for fabricating a semiconductor, which includes an etching process employing the etching composition. The etching composition of the invention shows a high etching selectivity for a nitride film with respect to an oxide film. Thus, when the etching composition of the present invention is used to remove a nitride film, the effective field oxide height (EEH) may be easily controlled by controlling the etch rate of the oxide film. In addition, the deterioration in electrical characteristics caused by damage to an oxide film or etching of the oxide film may be prevented, and particle generation may be prevented, thereby ensuring the stability and reliability of the etching process.

17 Claims, 9 Drawing Sheets

ETCHING COMPOSITION AND METHOD FOR FABRICATING SEMICONDUCTOR DEVICE USING THE SAME

CROSS-REFERENCE TO RELATED APPLICATIONS

The present application claims priority of Korean Patent Application No. 10-2011-0136430, filed on Dec. 16, 2011, which is incorporated herein by reference in its entirety.

BACKGROUND

1. Field

Exemplary embodiments of the present invention relate to an etching composition, and more particularly, to a high-selectivity etching composition capable of selectively removing a nitride film while minimizing the etch rate of an oxide film and to a method for fabricating a semiconductor, which includes an etching process employing the etching composition.

2. Description of the Related Art

In semiconductor fabrication processes, oxide films such as a silicon oxide film ($SiO_2$) and nitride films such as a silicon nitride film ($SiN_x$) are typically used as insulating films. These oxide and nitride films may be used alone or stacked alternately with each other. In addition, these oxide and nitride films are used as hard masks for conductive patterns such as metal interconnects.

In a wet-etching process for removing nitride films, a mixture of phosphoric acid and deionized water is generally used. Deionized water is used to prevent a decrease in the etch rate of the nitride film and a change in the etching selectivity of the nitride films with respect to oxide films. However, even when the amount of deionized water changes minutely, a failure occurs in the nitride film etching process. Phosphoric acid, one of strong acids, is corrosive, and thus difficult to handle.

In an attempt to solve these problems, a technology of removing a nitride film using an etching composition comprising hydrofluoric acid (HF) and phosphoric acid ($H_3PO_4$) or nitric acid ($HNO_3$) and phosphoric acid ($H_3PO_4$) was suggested, but resulted in a decrease in the etching selectivity for a nitride film with respect to an oxide film. In addition, a technology of removing a nitride film using an etching composition comprising phosphoric acid and silicate or phosphoric acid and silicic acid was also suggested, but silicate or silicic acid is not suitable for use in semiconductor fabrication processes, because it causes generation of particles that may affect a substrate.

FIGS. 1a and 1b are cross-sectional views showing a device isolation process for a flash memory device.

As shown in FIG. 1a, a tunnel oxide film 11, a polysilicon film 12, a buffer oxide film 13 and a pad nitride film 14 are sequentially formed on a substrate 10. Subsequently, the polysilicon film 12, the buffer oxide film 13 and the pad nitride film 14 are selectively etched to form trenches. Then, a SOD oxide film 15 is formed so as to gap-fill the trench. A CMP process is then performed on the SOD oxide film 15, using the pad nitride film 14 as a polishing stop film.

Then, as shown in FIG. 1b, the pad nitride film 14 is removed by wet-etching with a phosphoric acid solution, and the buffer oxide film 13 is removed by a cleaning process. Thus, a device isolation film 15A is formed in a field region. However, when phosphoric acid is used in this process for removing the pad nitride film 14, not only the pad nitride film 14 but also the SOD oxide film 15 are etched due to a decrease in the etching selectivity for the nitride film with respect to the oxide film, which may make it difficult to control the effective field oxide height (EFH). Thus, a wet-etching time sufficient for removal of the nitride film may not be ensured, or an additional process is required, which results in changes that adversely affect the device characteristics.

Accordingly, there is a need for a high-selectivity etching composition that may selectively etches nitride films with respect to oxide films and, at the same time, does not cause problems such as particle generation.

SUMMARY

Exemplary embodiments of the present invention are directed to a high-selectivity etching composition that may selectively remove a nitride film while minimizing the etch rate of an oxide film and does not cause problems such as generation of particles that adversely affect device characteristics, and a method for fabricating a semiconductor device using the same.

In accordance with an exemplary embodiment of the present invention, an etching composition includes a silyl phosphate compound represented by the following formula 1, phosphoric acid and deionized water:

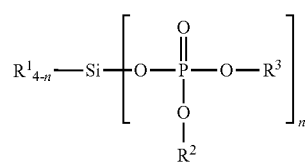

[Formula 1]

wherein $R^1$ is selected from the group consisting of hydrogen, hydroxyl, substituted or unsubstituted ($C_1$-$C_{20}$)alkyl, ($C_1$-$C_{20}$)alkoxy, ($C_2$-$C_{20}$)alkenyl, ($C_3$-$C_{20}$)cycloalkyl, amino($C_1$-$C_{20}$)alkyl, amino($C_1$-$C_{10}$)alkylamino($C_1$-$C_{10}$)alkyl, ($C_6$-$C_{20}$)aryl, ($C_1$-$C_{20}$)alkylcarbonyl, ($C_1$-$C_{20}$)alkylcarbonyloxy, and cyano($C_1$-$C_{10}$)alkyl;

wherein $R^2$ and $R^3$ are each independently selected from the group consisting of hydrogen, hydroxyl, substituted or unsubstituted ($C_1$-$C_{20}$)alkyl, ($C_1$-$C_{20}$)alkoxy, ($C_2$-$C_{20}$)alkenyl, ($C_3$-$C_{20}$)cycloalkyl, amino($C_1$-$C_{20}$)alkyl, amino($C_1$-$C_{10}$)alkylamino($C_1$-$C_{10}$)alkyl, ($C_6$-$C_{20}$)aryl, ($C_1$-$C_{20}$)alkylcarbonyl, ($C_1$-$C_{20}$)alkylcarbonyloxy, cyano($C_1$-$C_{10}$)alkyl, and a group represented by the following formula 3:

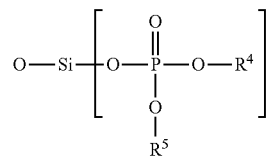

[Formula 3]

wherein $R^4$ and $R^5$ are each independently selected from the group consisting of hydrogen, ($C_1$-$C_{10}$)alkyl, ($C_2$-$C_{10}$)alkenyl, ($C_3$-$C_{20}$)cycloalkyl, amino($C_1$-$C_{10}$)alkyl and ($C_1$-$C_{10}$)alkyl substituted with one or more substituents selected from the group consisting of halogen, phenyl and cyclohexene oxide; and wherein n is an integer of $1 \leq n \leq 4$.

In accordance with another exemplary embodiment of the present invention, a method for fabricating a semiconductor device includes an etching process that is carried out using the etching composition including the silyl phosphate compound represented by the above formula 1, phosphoric acid and deionized water.

DETAILED DESCRIPTION

Figure 1A:
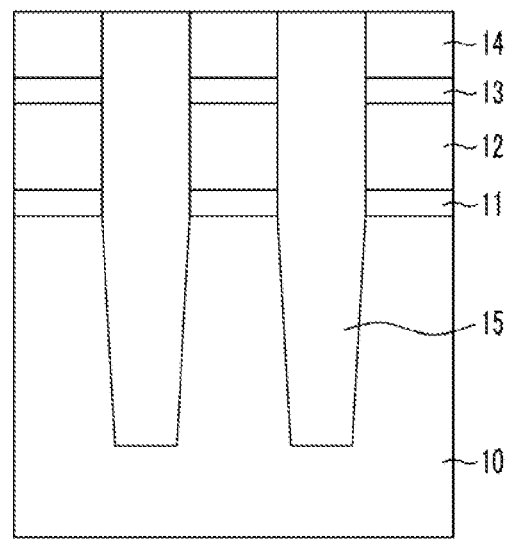
FIGS. 1a and 1b are cross-sectional views illustrating a device isolation process for a flash memory device according to the prior art.
Figure 1B:
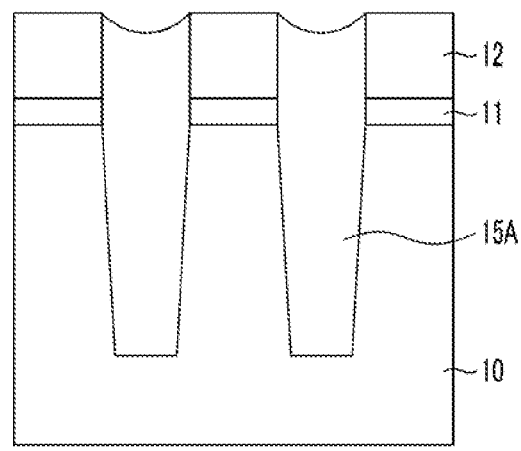

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also refers to a case where a third layer exists to between the first layer and the second layer or the substrate.

One aspect of the present invention is directed to an etching composition comprising a silyl phosphate compound, phosphoric acid and deionized water.

The silyl phosphate compound that is contained in the etching composition of the present invention preferably has at least one structure represented by the following formula 2:

[Si—O—P]  [Formula 2]

Specifically, the silyl phosphate compound which is contained in the etching composition of the present invention may have either the silyl phosphate of formula 2 or repeats of the silyl phosphate of formula 2.

Particularly, the silyl phosphate compound is preferably a compound represented by the following formula 1:

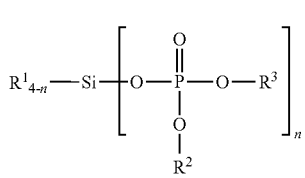

[Formula 1]

wherein $R^1$ is selected from the group consisting of hydrogen, OH, substituted or unsubstituted $(C_1-C_{20})$alkyl, $(C_1-C_{20})$alkoxy, $(C_2-C_{20})$alkenyl, $(C_3-C_{20})$cycloalkyl, amino$(C_1-C_{20})$alkyl, amino$(C_1-C_{10})$alkylamino$(C_1-C_{10})$alkyl, $(C_6-C_{20})$aryl, $(C_1-C_{20})$alkylcarbonyl, $(C_1-C_{20})$alkylcarbonyloxy, and cyano$(C_1-C_{10})$alkyl;

wherein $R^2$ and $R^3$ are each independently selected from the group consisting of hydrogen, OH, substituted or unsubstituted $(C_1-C_{20})$alkyl, $(C_1-C_{20}$ alkoxy, $(C_2-C_{20})$alkenyl, $(C_3-C_{20})$cycloalkyl, amino$(C_1-C_{20})$alkyl, amino$(C_1-C_{10})$alkylamino$(C_1-C_{10})$alkyl, $(C_1-C_{20})$aryl, $(C_1-C_{20})$alkylcarbonyl, $(C_1-C_{20})$alkylcarbonyloxy, cyano$(C_1-C_{10})$alkyl, and a group represented by the following formula 3:

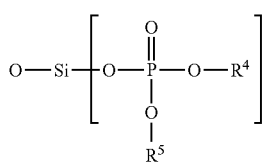

[Formula 3]

wherein $R^4$ and $R^5$ are each independently selected from the group consisting of hydrogen, $(C_1-C_{10})$alkyl, $(C_2-C_{10})$alkenyl, $(C_3-C_{20})$cycloalkyl, amino$(C_1-C_{10})$alkyl, and $(C_1-C_{10})$ alkyl substituted with one or more substituents selected from the group consisting of halogen, phenyl and cyclohexene oxide; and wherein n is an integer of $1 \leq n \leq 4$.

As used herein, the term "$(C_1-C_{10})$ alkyl" means a straight-chain or branched non-cyclic saturated hydrocarbon having 1 to 10 carbon atoms.

The term "$(C_1-C_{20})$alkyl" means a straight-chain or branched non-cyclic saturated hydrocarbon having 1 to 20 carbon atoms.

The term "$(C_2-C_{10})$alkenyl" means a straight-chain or branched non-cyclic hydrocarbon having 2 to 10 carbon atoms and containing at least one carbon-carbon double bond.

The term "$(C_2-C_{20})$alkenyl" means a straight-chain or branched non-cyclic hydrocarbon having 2 to 20 carbon atoms and containing at least one carbon-carbon double bond.

The term "$(C_1-C_{10})$alkoxy" means a straight-chain or branched non-cyclic hydrocarbon having one or more ether groups and 1 to 10 carbon atoms.

The term "$(C_1-C_{20})$alkoxy" means a straight-chain or branched non-cyclic hydrocarbon having one or more ether groups and 1 to 20 carbon atoms.

The term "$(C_3-C_{20})$cycloalkyl" means a cyclic saturated hydrocarbon having 3 to 20 carbon atoms.

The term "$(C_6-C_{20})$aryl" means an aromatic hydrocarbon having 6 to 20 carbon atoms.

In one exemplary embodiment, $R^1$ may be selected from the group consisting of hydrogen, $(C_1-C_{10})$alkyl, $(C_7-C_{10})$alkenyl, $(C_3-C_{20})$cycloalkyl, amino$(C_1-C_{10})$alkyl and $(C_1-C_{10})$alkyl substituted with one or more substituents selected from the group consisting of halogen, phenyl and cyclohexene oxide.

In another exemplary embodiment, $R^1$ may be selected from the group consisting of hydrogen, $(C_1-C_6)$alkyl, $(C_2-C_6)$alkenyl, $(C_3-C_{10})$cycloalkyl, amino$(C_1-C_6)$alkyl, and $(C_1-C_6)$alkyl substituted with one or more substituents selected from the group consisting of halogen, phenyl and cyclohexene oxide.

In one exemplary embodiment, $R^2$ and $R^3$ may be each independently selected from hydrogen, OH, $(C_1-C_{10})$alkyl, $(C_1-C_{10})$alkoxy, $(C_2-C_{20})$alkenyl, $(C_3-C_{20})$cycloalkyl, amino$(C_1-C_{10})$alkyl, $(C_1-C_{10})$alkyl substituted with at least one phenyl, and a group represented by formula 3.

In another exemplary embodiment, $R^2$ and $R^3$ may be each independently selected from the group consisting of hydrogen, OH, $(C_1-C_6)$alkyl, $(C_1-C_6)$alkoxy, $(C_2-C_6)$alkenyl, $(C_3-C_{10})$cycloalkyl, amino$(C_1-C_6)$alkyl, $(C_1-C_6)$alkyl substituted with at least one phenyl, and a group represented by formula 3.

In one exemplary embodiment, $R^4$ and $R^5$ may be each independently selected from the group consisting of hydrogen, $(C_1-C_6)$alkyl, $(C_2-C_6)$alkenyl, $(C_3-C_{10})$cycloalkyl, amino$(C_1-C_6)$alkyl, and $(C_1-C_6)$alkyl substituted with one or more substituents selected from the group consisting of halogen, phenyl and cyclohexene oxide.

In another exemplary embodiment, $R^4$ and $R^5$ may be each independently selected from the group consisting of $(C_3-C_{20})$cycloalkyl, $(C_2-C_{10})$alkenyl, amino$(C_1-C_{10})$alkyl, and $(C_1-C_{10})$alkyl substituted with at least one halogen.

In still another exemplary embodiment, $R^4$ and $R^5$ may be each independently selected from the group consisting of $(C_3-C_{10})$cycloalkyl, $(C_2-C_6)$alkenyl, amino$(C_1-C_6)$alkyl, and a $(C_1-C_6)$alkyl substituted with at least one halogen.

The silyl phosphate compound that is contained in the etching composition of the present invention may easily control the effective field oxide height (EFH) by controlling the etch rate of an oxide film.

The content of the silyl phosphate compound in the etching composition is preferably 0.01-15 wt %, more preferably 0.5-15 wt. %, even more preferably 1-15 wt %, and most preferably 3-7 wt %, based on the total weight of the etching composition.

If the content of the silyl phosphate compound is less than 0.01 wt %, a high etching selectivity for a nitride film may not be obtained. If the content of the silyl phosphate compound is more than 15 wt %, an increase in the content does not lead to a further increase in the etching selectivity and may cause problems such as generation of particles.

Phosphoric acid that is contained in the etching composition of the present invention serves to promote etching by providing hydrogen ions to the etching composition.

The content of phosphoric add in the etching composition is preferably 70-99 wt %, more preferably 70-90 wt %, and even more preferably 75-85 wt %, based on the total weight of the etching composition.

If the content of phosphoric acid in the etching composition is less than 70 wt %, a nitride film may not be easily removed, and particles may be generated. If the content of phosphoric acid is more than 99 wt %, a high etching selectivity for a nitride film may not be obtained.

Water that is contained in the etching composition is not specifically limited and is preferably deionized water.

In addition, the etching composition of the present invention may further comprise any additive that is generally used in the art, in order to improve the etching performance thereof. Examples of an additive that may be used in the present invention include surfactants, sequestering agents, anti-corrosive agents and the like.

The etching composition of the present invention, comprising the silyl phosphate compound and phosphoric acid, shows a significantly high etching selectivity for a nitride film with respect to an oxide film, and thus may be used in a nitride film etching process.

Thus, in the nitride film etching process employing the etching composition of the present invention, the EFH may be easily controlled by minimizing the etch rate of an oxide film. In addition, in the process of selectively etching and removing of a nitride film using the etching composition, the deterioration in electrical properties caused by damage to an oxide film or etching of the oxide film may be prevented, and particles are not generated, which results in improvement of device characteristics.

In accordance with another aspect of the present invention, a method for fabricating a semiconductor device comprises an etching process that is carried out using the etching composition of the present invention.

In one exemplary embodiment, this etching process may comprise etching a nitride film. Particularly, the etching process may comprise selectively etching a nitride film with respect to an oxide film.

Examples of a nitride film that may be etched by the etching composition of the present invention include SiN films, SiON films and the like.

In addition, an oxide film may be at least one film selected from the group consisting of silicon oxide films, for example, SOD (spin-on-dielectric) films, HDP (high-density plasma) films, thermal oxide films, BPSG (borophosphate silicate glass) films, PSG (phosphosilicate glass) films, BSG (borosilicate glass) films, PSZ (polysilazane) films, FSG (fluorinated silicate glass) films, LPTEOS (low-pressure tetraethylorthosilicate) films, PETEOS (plasma-enhanced tetraethylorthosilicate) films, HTO (high-temperature oxide) films, MTO (medium-temperature oxide) films, USG (undopped silicate glass) films, SOG (spin-on-glass) films, APL (advanced planarization layer) films, ALD (atomic layer deposition) films, plasma-enhanced oxide films, $O_3$-TEOS ($O_3$-tetraethylorthosilicate) films, and combinations thereof.

An etching process employing the etching composition of the present invention may be performed by a wet-etching method known in the art, for example, a dipping method or a spray method.

The etching process may be carried out at a temperature between 50 and 300° C. and preferably 100 and 200° C. The temperature of the etching process may be suitably changed in view of other processes and other factors.

In the method for fabricating a semiconductor device, comprising the etching process that is carried out using the etching composition of the present invention, a nitride film may be selectively etched from a structure in which a nitride film and an oxide film are stacked alternately or present together. In addition, particle generation, which was problematic in the prior-art etching process, may be prevented, thereby ensuring process stability and reliability.

Accordingly, this method may be efficiently applied to various semiconductor fabrication processes in which a nitride film is required to be selectively etched with respect to an oxide film.

Figure 2A:
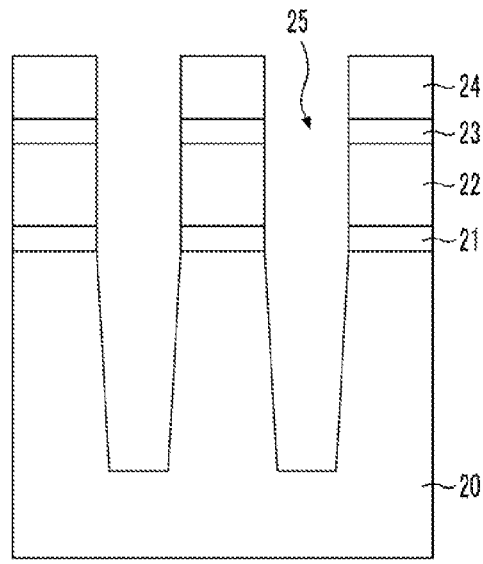
FIGS. 2a to 2c are cross-sectional views illustrating a device isolation process for a flash memory device, which includes an etching process employing an etching solution according to one embodiment of the present invention.
Figure 2B:
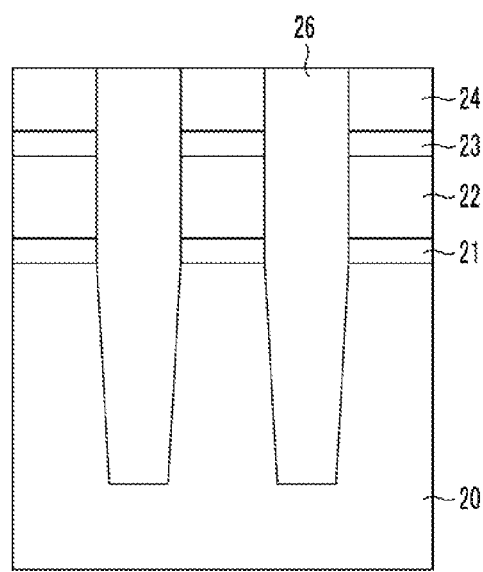
Figure 2C:
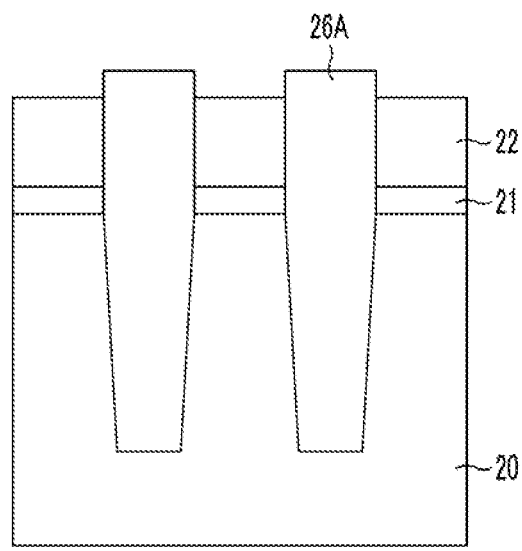

FIGS. 2a to 2c are cross-sectional views showing a device isolation process for a flash memory device, comprising an etching process employing an etching composition according to one exemplary embodiment of the present invention.

Referring to FIG. 2a, a tunnel oxide film 21, a polysilicon film 22, a buffer oxide film 23 and a pad nitride film 24 are sequentially formed on a substrate 20.

Then, the pad nitride film 24, the buffer oxide film 23, the polysilicon film 22 and the tunnel oxide film 21 are selectively etched by photolithography and etching processes to expose device isolation regions of the substrate 20.

Then, the exposed regions of the substrate 20 are selectively etched using the pad nitride film 24 as a mask to form a plurality of trenches 25 having a predetermined depth from the surface.

Referring to FIG. 2b, an oxide film 26 is formed on the entire surface of the substrate 20, for example, by chemical vapor deposition (CVD), so as to gap-fill the plurality of trenches 25.

Then, a chemical mechanical polishing (CMP) process is carried out on the oxide film 26 using the pad nitride film 24 as a polishing stop film.

Then, a cleaning process is carried out by dry etching.

Referring to FIG. 2c, the pad nitride film 24 is selectively removed by a wet-etching process using the etching composition of the present invention, and then the buffer oxide film 23 is removed by a cleaning process, thereby forming a device isolation film 26A in the field region.

As shown in FIG. 2c, when the high-selectivity etching composition having a high etching selectivity for a nitride film with respect to an oxide film is used according to the present invention, the nitride film may be completely selectively removed for a sufficient time while the etching of the oxide film gap-filled in the STI pattern is minimized. Accordingly, the effective field oxide height (EFH) may be easily controlled, which is possible to prevent the deterioration in electrical characteristics caused by damage to an oxide film or etching of the oxide film and prevent particle generation, thereby resulting in improvement in device characteristics.

While the above embodiment has been described with respect to the flash memory device, the high-selectivity etching composition of the present invention may also be applied to a device isolation process for a DRAM device.

FIGS. 3a to 3f are cross-sectional views showing a process for forming a channel for a flash memory device, which comprises an etching process employing the etching composition according to one exemplary embodiment of the present invention.

Figure 3A:
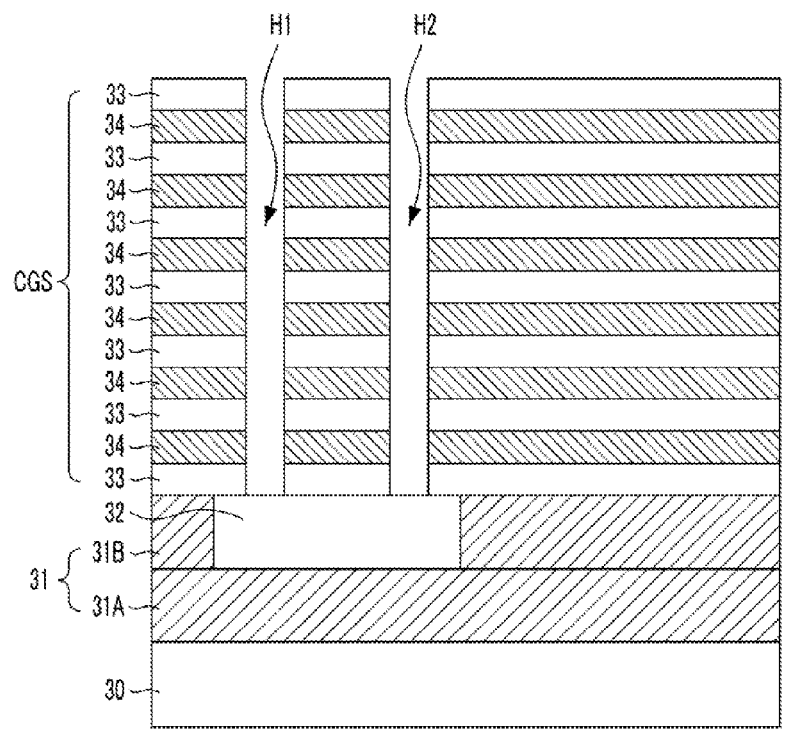
FIGS. 3a to 3f are cross-sectional views illustrating a process for forming a pipe channel for a flash memory device, which includes an etching process employing an etching solution according to one embodiment of the present invention.

Referring to FIG. 3a, a pipe gate electrode film 31 in which a nitride film 32 for forming a pipe channel is buried is formed on a substrate 30. First and second conductive films 31A and 31B constituting the pipe gate electrode film 31 may include, for example, impurity-doped polysilicon.

More specifically, the first conductive film 31A is formed on the substrate 30, and a nitride film is deposited on the first conductive film 31A and patterned to form a nitride film 32 for forming a pipe channel. Subsequently, the second conductive film 318 is formed on the first conductive film 31A exposed through the nitride film 32. The first and second conductive films 31A and 318 form the pipe gate electrode film 31.

Then, for formation of a plurality of memory cells that are vertically stacked, a first interlayer insulating film 33 and a first gate electrode film 34 are alternately stacked on the structure resulting from the above process. Hereinafter, for the convenience of description, the alternating stack of the first interlayer insulating film 33 and the first gate electrode film 34 will be referred to as a cell gate structure (CGS).

Herein, the first interlayer insulating film 33 serves to separate a memory cell into a plurality of layers and may comprise, for example, an oxide film, and the first gate electrode film 34 may comprise, for example, impurity-doped polysilicon. In this embodiment, a plurality of the first gate electrode film 34 is shown to consist of six layers, but is not limited thereto.

Then, the cell gate structure (CGS) is selectively etched to form a pair of first and second holes H1 and H2 that expose the nitride film 32. The first and second holes H1 and H2 are regions for forming channels for a memory cell.

Figure 3B:
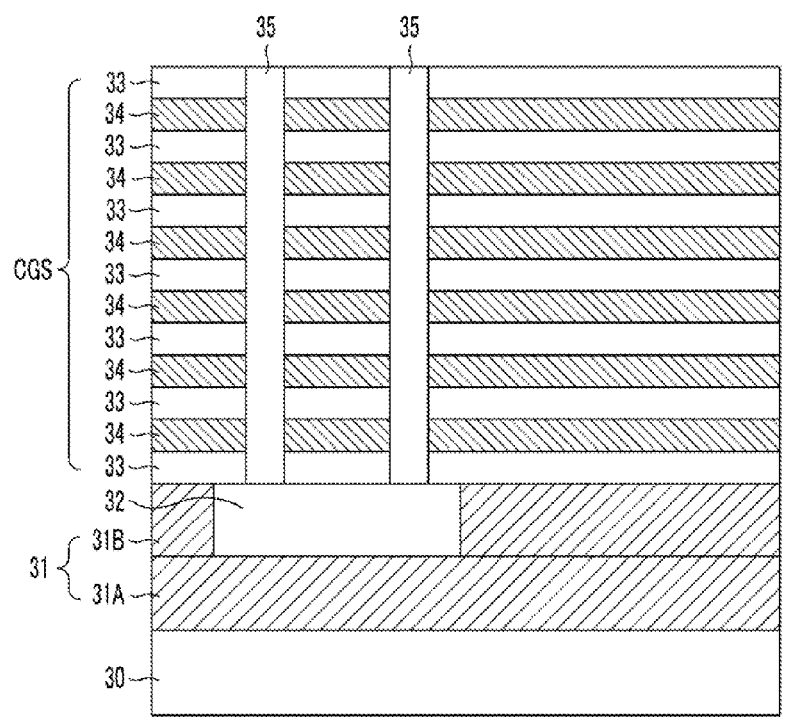

Referring to FIG. 3b, a nitride film 35 is formed, which is buried in the first and second holes H1 and H2. The nitride film 35 serves to prevent damage occurring in a subsequent trench formation process (see FIG. 3c) when the first gate electrode film 34 is exposed through the first and second holes H1 and H2.

Figure 3C:
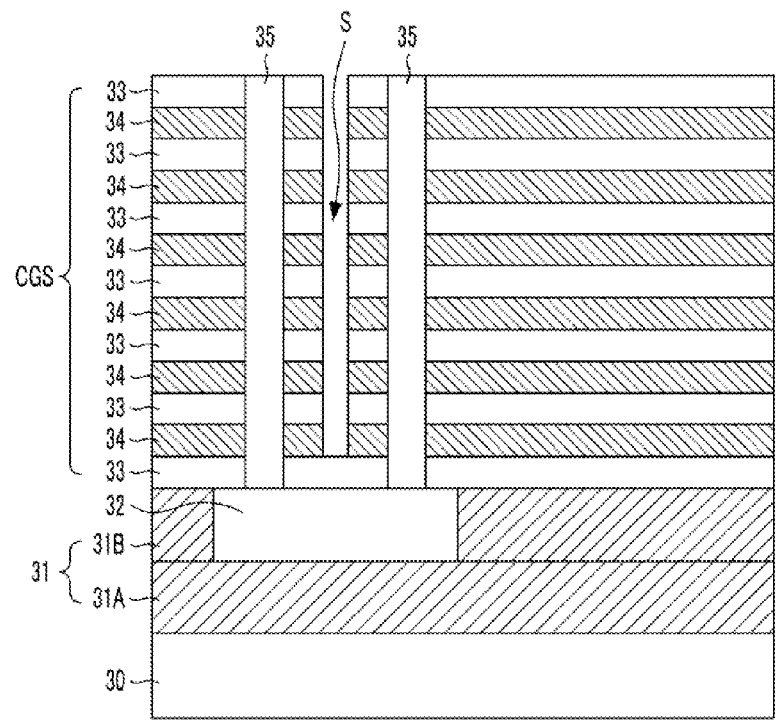

Referring to FIG. 3c, the cell gate structure (CGS) between a pair of the first and second holes H1 and H2 is selectively etched so that the plurality of the first gate electrode film 34 is separated into portions corresponding to the first and second holes H1 and H2, respectively, thereby forming a trench S.

Figure 3D:
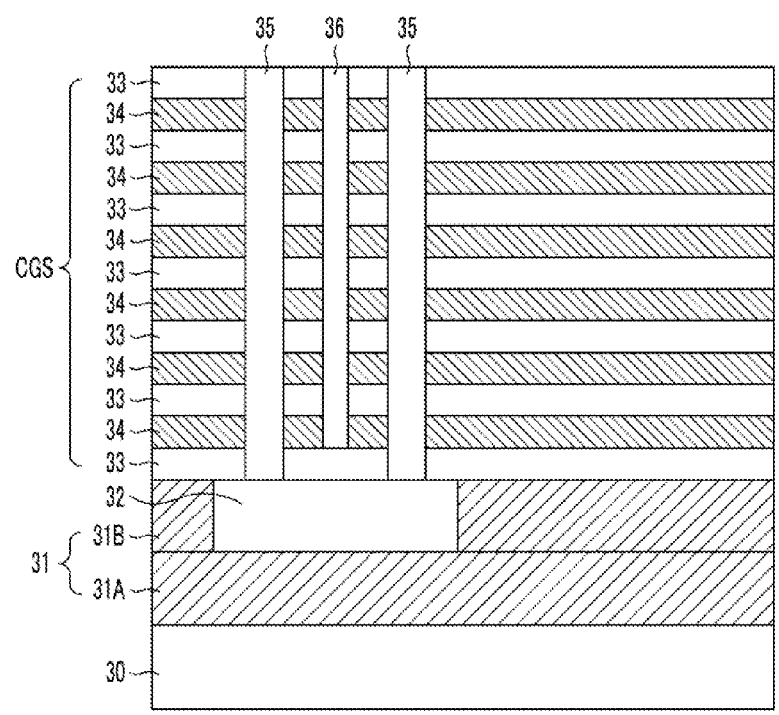

Referring to FIG. 3d, a sacrificial film 36 is formed, which is buried in the trench S.

Figure 3E:
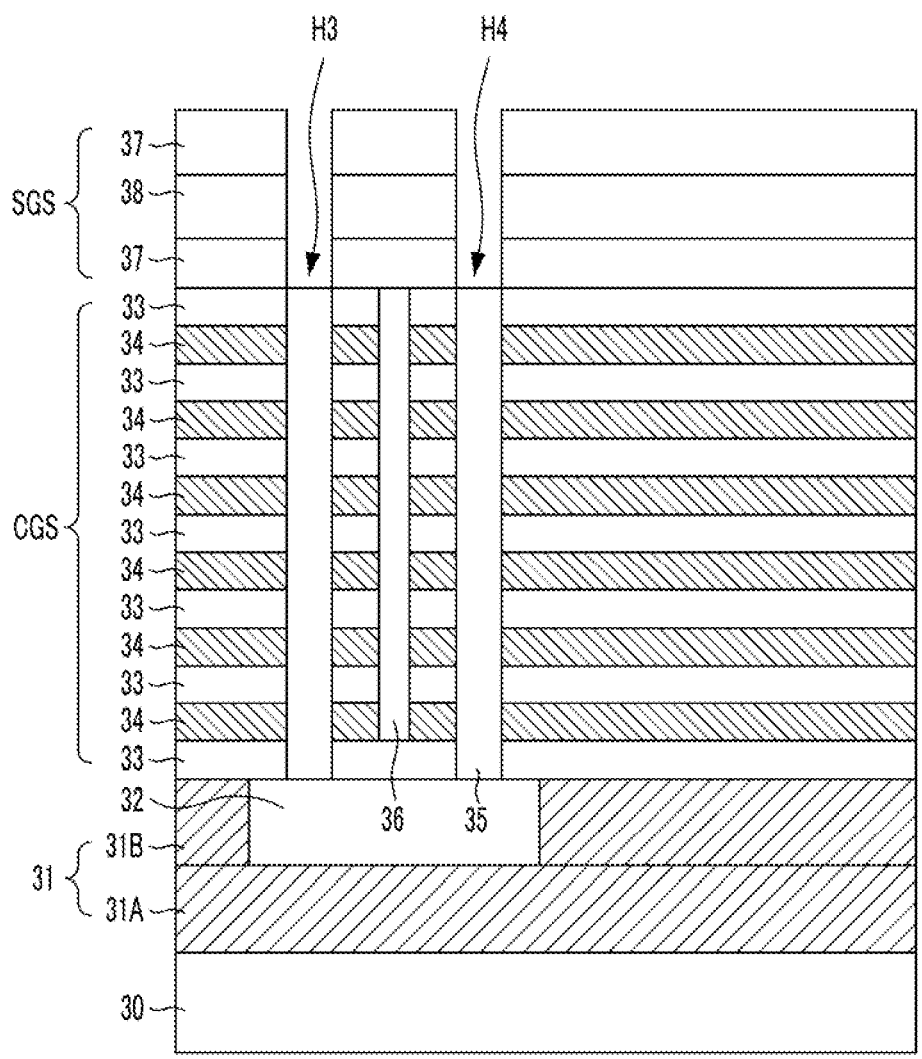

Referring to FIG. 3e, for formation of a selection transistor, a second interlayer insulating film 37, a second gate electrode film 38 and a second interlayer insulating film 37 are sequentially formed on the structure resulting from the above process. Hereinafter, for the convenience of description, the stack of the second interlayer insulating film 37, the second gate electrode film 38 and the second interlayer insulating film 37 will be referred to as a selection gate structure (SGS).

The second interlayer insulating film 37 may comprise, for example, an oxide film, and the second gate electrode film 38 may comprise, for example, impurity-doped polysilicon.

Then, the selection gate structure (SGS) is selectively etched to form third and fourth holes H3 and H4 that expose the nitride film 35 buried in a pair of the first and second holes H1 and H2. The third and fourth holes H3 and H4 are regions in which a channel for a selection transistor is to be formed.

Figure 3F:
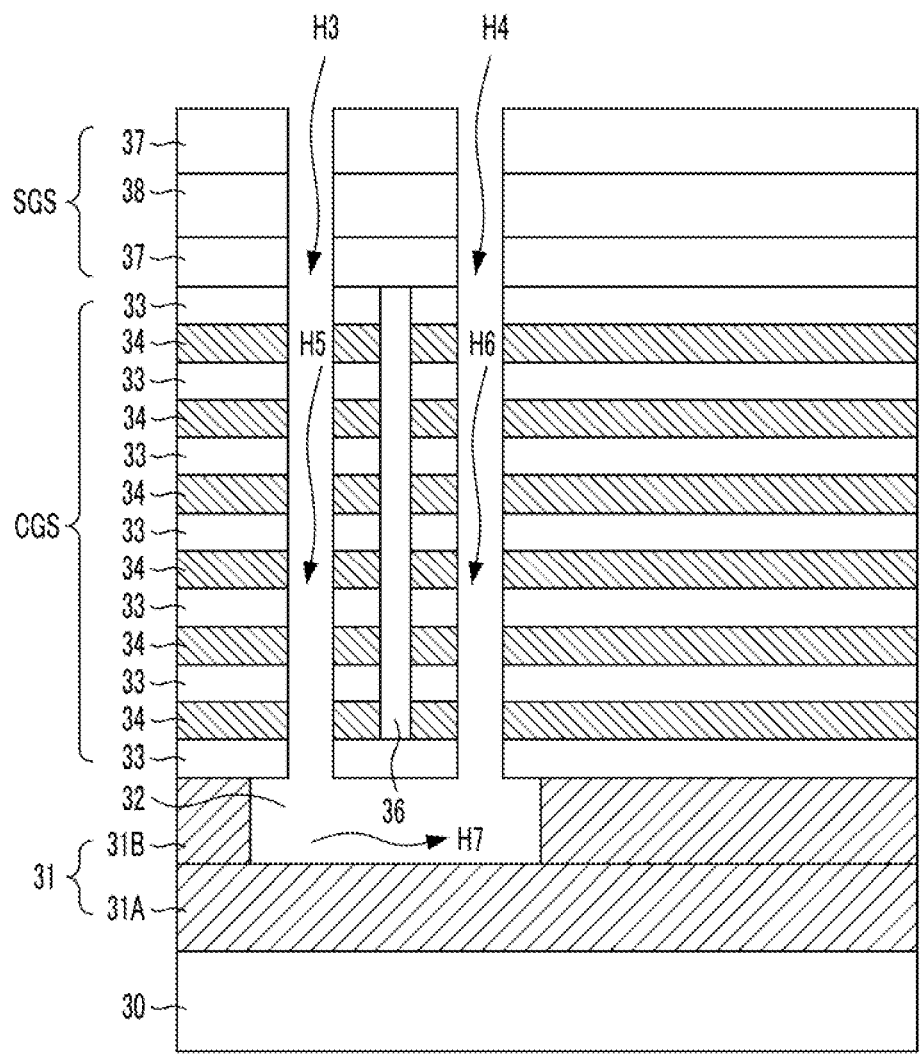

Referring to FIG. 3f, the nitride film 35 exposed through the third and fourth holes H3 and H4, and the nitride film 32 disposed below the nitride film 35, are selectively removed by a wet-etching process using the etching composition of the present invention.

This etching process results in not only the formation of a pair of channel holes H5 and H5 in which a channel film for a memory cell is to be formed, but also the formation of a pipe channel hole H7 disposed below the channel holes H5 and H6 so as to connect the channel holes H5 and H6 to each other. In this etching process, the nitride films may be completely selectively removed for a sufficient time without loss of the oxide film by using the high-selectivity etching composition of the present invention, and thus the pipe channel may be accurately formed without loss of the profile. In addition, particle generation, which was problematic in the prior art, may be prevented, thus ensuring the stability and reliability of the process.

Then, subsequent processes, for example, a process for forming a floating gate and a process for forming a control gate, are carried out, thereby forming a flash memory device.

Figure 4A:
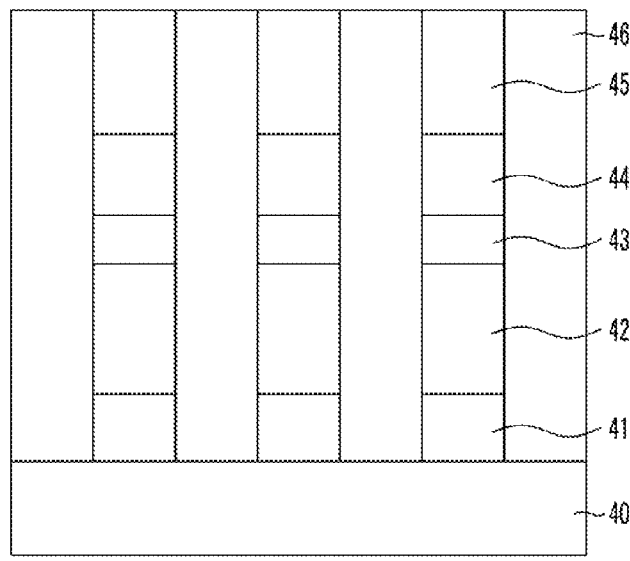
FIGS. 4a and 4b are cross-sectional views illustrating a process for forming a diode for a phase-change memory device, which includes an etching process employing an etching solution according to one embodiment of the present invention.
Figure 4B:
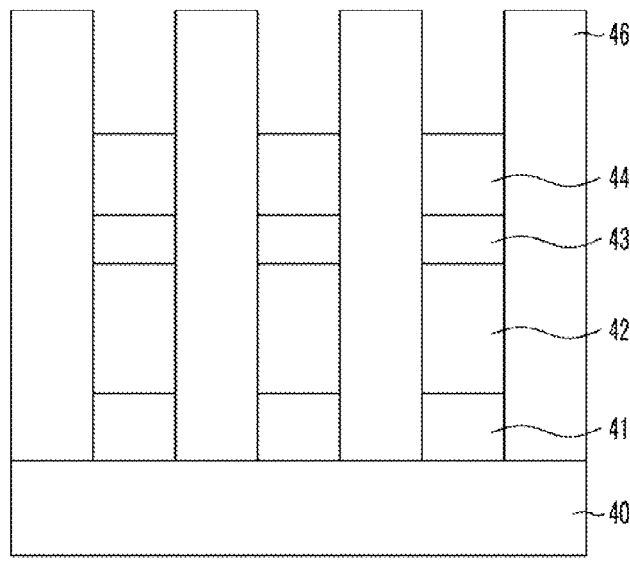

FIGS. 4a and 4b are cross-sectional views illustrating a process for forming a diode for a phase-change memory device, which comprises an etching process employing the etching composition according to another embodiment of the present invention.

Referring to FIG. 4a, an insulating structure having holes exposing a conductive region 41 is provided on a substrate 40. The conductive region 41 may be, for example, an n+ impurity region.

Then, a polysilicon film 42 is formed so as to fill portions of the holes, followed by ion implantation of impurities, thereby forming diodes.

Then, a titanium silicide film 43 is formed on the polysilicon film 42. The titanium silicide film 43 may be formed by forming a titanium film and heat-treating the formed titanium film so as to react with the polysilicon film 42.

Then, a titanium nitride film 44 and a nitride film 45 are sequentially formed on the titanium silicide film 43.

Then, a dry etching process is carried out using a hard mask to form an oxide film 46 in the isolated space between the formed diodes, and an a CMP process is carried out to form primary structures of bottom electrodes isolated from each other.

Referring to FIG. 4b, the structure resulting from the above process is subjected to a et-etching process using the etching composition of the present invention to selectively remove the nitride film 45. When the high-selectivity etching composition of the present invention is used to remove the nitride film, the nitride film may be completely selectively removed for a sufficient time without loss of the oxide film. In addition, the deterioration in electrical characteristics caused by damage to the oxide film or etching of the oxide film may be prevented and particle generation may be prevented, thus improving the device characteristics.

Then, titanium is deposited in the spaces remaining after removal of the nitride film 45, thereby forming bottom electrodes.

In addition to the above-described processes, a semiconductor device-fabricating method comprising an etching process that is carried out using the etching composition of the present invention may be applied particularly to processes in which selective removal of a nitride film is required. Such processes are preferably include processes in which a nitride film is required to be selectively etched from a structure in which a nitride film and an oxide film are stacked alternately or present together.

Hereinafter, the present invention will be described in further detail with reference to examples and comparative examples. It is to be understood, however, that these examples are illustrative purposes and are not intended to limit the scope of the present invention.

Examples 1 to 12

A silyl phosphate compound represented by the above formula 1 and phosphoric acid were mixed with each other at the weight ratios shown in Table 1 below in a balance of deionized water, to prepare etching compositions of the present invention. A 85% aqueous solution of phosphoric acid was used for these Examples. Using the etching compositions, etching for a nitride film and an oxide film was carried out at a process temperature of 157° C. Etch rate and selectivity for the nitride film and the oxide film were measured using an ellipsometer (NANO VIEW, SEMG-1000) that is a film thickness measurement system. The results of the measurement are shown in Table 2 below. The etch rate was determined by etching each of the films for 300 seconds and measuring the difference between the thickness of each film before etching and the film thickness of each film after etching. Thus, the etch rate is obtained by dividing the thickness difference by the etching time (minute). The etching selectivity is expressed as the ratio of the etch rate of the nitride film to that of the oxide film.

TABLE 1

| | $R^1$ | $R^2$ | $R^3$ | n | Content (wt %) of silyl phosphate compound | Content (wt %) of phosphoric acid |
|---|---|---|---|---|---|---|
| Example 1 | — | OH | OH | 4 | 0.01 | 81.60 |
| Example 2 | $CH_3$ | OH | OH | 2 | 0.5 | 80.75 |
| Example 3 | H | $CH_3$ | OH | 3 | 1 | 81.60 |
| Example 4 | $CH_3$ | OH | –CH=CH–CH₃ (allyl group) | 1 | 4 | 81.60 |
| Example 5 | $CH_3$ | OH | OH | 3 | 4 | 79.60 |
| Example 6 | –CH=CH–CH₃ (allyl group) | compound of formula 3 [$R^4$: cyclohexyl-; $R^5$: –CH=CH–CH₃] | OH | 2 | 3 | 81.9 |

TABLE 1-continued

| | R¹ | R² | R³ | n | Content (wt %) of silyl phosphate compound | Content (wt %) of phosphoric acid |
|---|---|---|---|---|---|---|
| Example 7 | CH₂=CHCH₂– | OH | compound of formula 3 [R⁴: H₂N-CH₂CH₂-NH-CH₂CH₂CH₂CH₃; R⁵: Cl-CH₂CH₂CH₂CH₃] | 2 | 5 | 80.75 |
| Example 8 | Cl-CH₂CH₂CH₂CH₃ | MeO | methylcyclohexyl | 3 | 7 | 74.05 |
| Example 9 | H₂N-CH₂CH₂-NH-CH₂CH₂CH₂CH₃ | H₂N-CH₂CH₂-NH-CH₂CH₂CH₂CH₃ | EtO | 2 | 7 | 74.05 |
| Example 10 | methylcyclohexyl | OH | CH₂=CHCH₂– | 2 | 7 | 74.05 |
| Example 11 | epoxycyclohexyl-propyl | OH | CH₂=CH– | 2 | 10 | 72.05 |
| Example 12 | 1,1-diphenylethyl | OH | 1,1-diphenylethyl | 2 | 7 | 76.05 |

TABLE 2

| | Process temperature (° C.) | Etch rate (Å/min) of nitride film | Etch rate (Å/min) of oxide film | | | Selectivity | |
|---|---|---|---|---|---|---|---|
| | | | ThOx | LP-TEOS | BPSG | LP-TEOS | BPSG |
| Example 1 | 157 | 59.72 | 0 | 1.00 | 0.10 | 59.72 | 597 |
| Example 2 | 157 | 60.00 | 0 | 0.74 | 0.08 | 81.08 | 750 |
| Example 3 | 157 | 60.12 | 0 | 0.97 | 0.09 | 61.97 | 668 |
| Example 4 | 157 | 60.23 | 0 | 0.87 | 0.08 | 69.23 | 752.8 |
| Example 5 | 157 | 59.87 | 0 | 0.91 | 0.07 | 65.79 | 855.2 |
| Example 6 | 157 | 60.17 | 0 | 0.61 | 0.09 | 98.63 | 68.5 |
| Example 7 | 157 | 60.01 | 0 | 0.84 | 0.08 | 71.44 | 750.1 |
| Example 8 | 157 | 59.81 | 0 | 0.79 | 0.08 | 75.71 | 748.3 |
| Example 9 | 157 | 60.01 | 0 | 0.88 | 0.10 | 68.19 | 600.1 |
| Example 10 | 157 | 59.21 | 0 | 0.74 | 0.08 | 80.01 | 740.1 |
| Example 11 | 157 | 60.10 | 0 | 0.87 | 0.09 | 69.08 | 667.7 |
| Example 12 | 157 | 60.08 | 0 | 0.78 | 0.08 | 77.02 | 751 |

Comparative Examples 1 to 3

In Comparative Example 1, etching was carried out using phosphoric acid at a process temperature of 157° C. Etch rate and etching selectivity were measured in the same manner as the above Examples. In Comparative Example 2, etching was carried out using a mixture comprising 0.05% hydrofluoric acid and phosphoric acid at a low temperature of 130° C. In Comparative Example 3, etching was carried out using the same mixture as that of Comparative Example 2 at a process temperature of 157° C. In Comparative Examples 2 and 3, the etch rate and selectivity were measured in the same manner as the above Examples. The phosphoric acid used in Comparative Examples 1 to 3 was a 85% aqueous solution of phosphoric acid. The results of measurement in Comparative Examples 1 to 3 are shown in Table 3 below.

TABLE 3

| | Etching composition | Process temp. (° C.) | Etch rate of nitride film (Å/min) | Etch rate (Å/min) of oxide film (Å/min) | | | Selectivity | |
|---|---|---|---|---|---|---|---|---|
| | | | | ThOx | LP-TEOS | BPSG | LP-TEOS | BPSG |
| Comp. Example 1 | Phosphoric acid | 157 | 61.32 | 1.1 | 13.19 | 9.85 | 4.64 | 6.23 |
| Comp. Example 2 | Phosphoric acid + hydrofluoric acid (0.05%) | 130 | 15.44 | 0 | 2.3 | 1.03 | 6.71 | 14.99 |
| Comp. Example 3 | Phosphoric acid + hydrofluoric acid (0.05%) | 157 | 76.12 | 5.67 | 32.14 | 20.48 | 2.36 | 3.71 |

As can be seen in Tables 2 and 3, the etching compositions of Examples 1 to 12 showed a significantly high etching selectivity for the nitride film with respect to the oxide film compared to those of Comparative Examples 1 to 3. Thus, when the high-selectivity etching composition of the present invention is used, the EEH may be easily controlled by controlling the etch rate of the oxide film, and damage to the oxide film may be prevented. In addition, particle generation, which was problematic in the prior art, may be prevented, thus ensuring the stability and reliability of the etching process.

Examples 13 and 4 and Comparative Example 4

In Examples 13 and 14 (as referred to 4% SiOP HSP and 5% SiOP HSP, respectively), each of 4 wt % of a silyl phosphate compound (CH$_3$—Si[O—P(=O)(OH)$_2$]$_3$) and 5 wt % of a silyl phosphate compound (CH$_3$—Si[O—P(=O)(OH)$_2$]$_3$) was mixed with a respective phosphoric acid. Etching for a nitride film and an oxide film was carried out, using each of the mixtures, immediately after mixing (0 hour) and at 8 hours after mixing. The etch rates and selectivity for the nitride film and the oxide film were measured. In Comparative Example 4 (base PA), the etch rate and selectivity for a nitride film to and an oxide film were evaluated using phosphoric acid in the same manner as Examples 13 and 14. The evaluation was performed at a process temperature of 160° C. The phosphoric acid used in Examples 13 and 14 was a 85% aqueous solution of phosphoric acid. The etch rate was determined by etching each of the films for 300 seconds and measuring the difference between the thickness of each film before etching and the film thickness of the each film after etching. Thus, the etch rate is obtained by dividing the thickness difference by the etching time (minute). The etching selectivity is expressed as the ratio of the etch rate of the nitride film to that of the PSZ film.

TABLE 4

| | | Etch rate (Å/min) of nitride film | Etch rate (Å/min) of oxide film | | Selectivity (nitride film/PSZ) |
|---|---|---|---|---|---|
| | | | PSZ | BPSG | |
| Example 13 | 0 hr | 63.1 | −1.2 | 38.9 | >60 |
| | After 8 hr | 62.9 | −0.83 | 39.6 | >60 |
| Example 14 | 0 hr | 62.8 | −1.0 | 25.6 | >60 |
| | After 8 hr | 62.8 | −1.3 | 25.1 | >60 |

TABLE 4-continued

| | | Etch rate (Å/min) of nitride film | Etch rate (Å/min) of oxide film | | Selectivity (nitride film/PSZ) |
|---|---|---|---|---|---|
| | | | PSZ | BPSG | |
| Comparative Example 4 | 0 hr | 60 | 15 | 90 | <4 |
| | After 8 hr | 60 | 15 | 90 | <4 |

Figure 5:
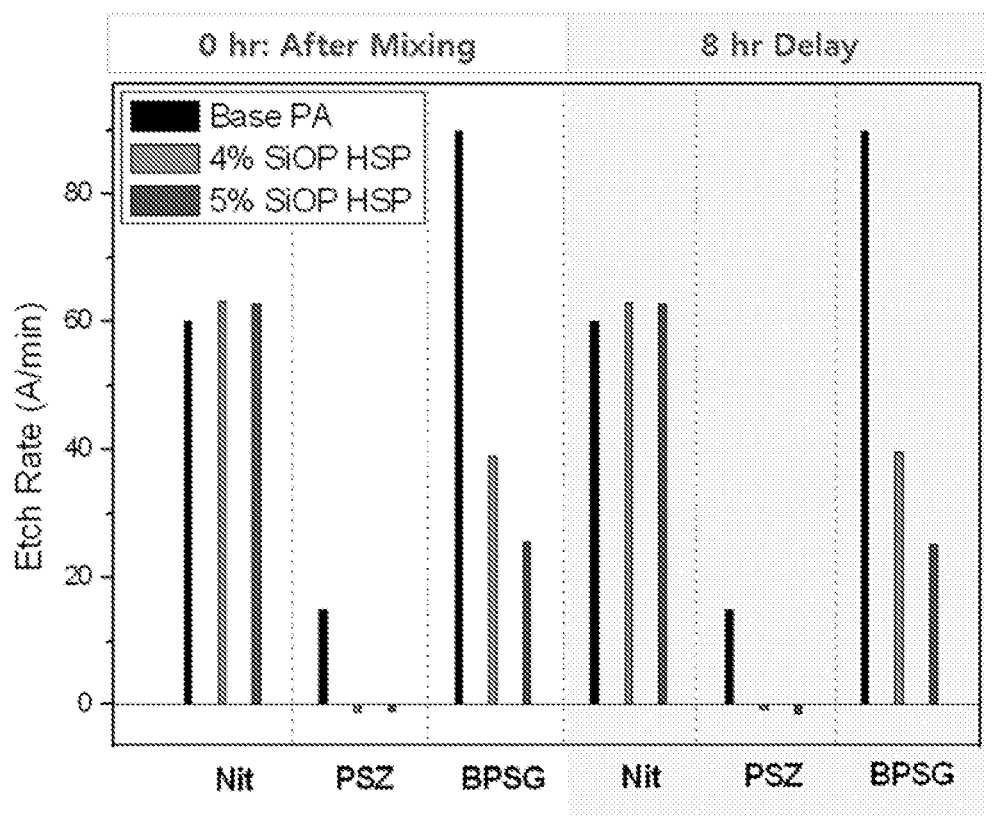
FIG. 5 is a graphic diagram showing the etch rates measured in Examples 3 and 14 and Comparative Example 4.

As can be seen in Table 4 above and FIG. 5, the etching compositions of the present invention showed a very high etching selectivity for the nitride film compared to the prior etching composition comprising phosphoric acid. Thus, when the high-selectivity etching composition of the present invention is used to remove a nitride film, the nitride film may be selectively etched, while the deterioration in electrical characteristics caused by damage to the oxide film or etching of the oxide film may be prevented and particle generation may be prevented, which improves the device characteristics.

As described above, the etching composition of the present invention shows a high etching selectivity for a nitride film with respect to an oxide film, and thus enables the EFH to be easily controlled by controlling the etch rate of the oxide film.

Accordingly, the present invention may be applied to a wide range of processes, including semiconductor fabrication processes in which selective removal of a nitride film with respect to an oxide film is carried out, for example, a device isolation process for a flash memory device, a process for forming a pipe channel for a 3D flash memory device, a process for forming a diode for a phase-change memory device, and so on. The present invention may thus improve the efficiency of such processes.

While the present invention has been described with respect to the specific embodiments, it will be apparent to those skilled in the art that various changes and modifications may be made without departing from the spirit and scope of the invention as defined in the following claims.

What is claimed is:

1. An etching composition comprising a silyl phosphate compound represented by the following formula 1, phosphoric acid and deionized water:

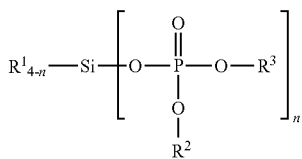

[Formula 1]

wherein R¹ is selected from the group consisting of hydrogen, hydroxyl, substituted or unsubstituted $(C_1-C_{20})$ alkyl, $(C_1-C_{20})$alkoxy, $(C_2-C_{20})$alkenyl, $(C_3-C_{20})$cycloalkyl, amino$(C_1-C_{20})$alkyl, amino$(C_1-C_{10})$ alkylamino$(C_1-C_{10})$alkyl, $(C_6-C_{20})$aryl, $(C_1-C_{20})$ alkylcarbonyl, $(C_1-C_{20})$alkylcarbonyloxy and cyano $(C_1-C_{10})$alkyl;

wherein R² and R³ are each independently selected from the group consisting of hydrogen, hydroxyl, substituted or unsubstituted $(C_1-C_{20})$alkyl, $(C_1-C_{20})$alkoxy, $(C_2-C_{20})$alkenyl, $(C_3-C_{20})$cycloalkyl, amino$(C_1-C_{20})$alkyl, amino$(C_1-C_{10})$ alkylamino$(C_1-C_{10})$alkyl, $(C_6-C_{20})$aryl, $(C_1-C_{20})$alkylcarbonyl, $(C_1-C_{20})$alkylcarbonyloxy, cyano$(C_1-C_{10})$alkyl, and a group represented by the following formula 3:

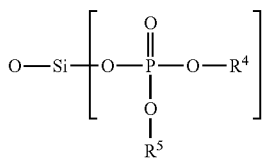

[Formula 3]

wherein R⁴ and R⁵ are each independently selected from the group consisting of hydrogen, $(C_1-C_{10})$alkyl, $(C_2-C_{10})$alkenyl, $(C_3-C_{20})$cycloalkyl, amino$(C_1-C_{10})$ alkyl, and $(C_1-C_{10})$alkyl substituted with one or more substituents selected from the group consisting of halogen, phenyl and cyclohexene oxide; and wherein n is an integer of 1≤n≤4.

2. The etching composition of claim 1, wherein R¹ is selected from the group consisting of hydrogen, $(C_1-C_{10})$ alkyl, $(C_2-C_{10})$alkenyl, $(C_3-C_{20})$cycloalkyl, amino$(C_1-C_{10})$ alkyl, and $(C_1-C_{10})$alkyl substituted with one or more substituents selected from the group consisting of halogen, phenyl and cyclohexene oxide.

3. The etching composition of claim 1, wherein R² and R³ are each independently selected from the group consisting of hydrogen, hydroxyl, $(C_1-C_{10})$alkyl, $(C_1-C_{10})$alkoxy, $(C_2-C_{10})$alkenyl, $(C_3-C_{20})$cycloalkyl, amino$(C_1-C_{10})$alkyl, $(C_1-C_{10})$alkyl substituted with at least one phenyl, and a group represented by the following formula 3:

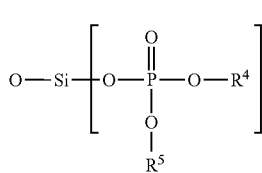

[Formula 3]

wherein R⁴ and R⁵ are each independently selected from the group consisting of hydrogen, $(C_1-C_{10})$alkyl, $(C_2-C_{10})$alkenyl, $(C_3-C_{20})$cycloalkyl, amino$(C_1-C_{10})$alkyl, and $(C_1-C_{10})$alkyl substituted with one or more substituents selected from the group consisting of halogen, phenyl and cyclohexene oxide.

4. The etching composition of claim 1, wherein the etching composition comprises 0.01-15 wt % of the silyl phosphate compound, 70-99 wt % of phosphoric acid and a balance of deionized water.

5. The etching composition of claim 1, wherein the etching composition further comprises one or more additives selected from the group consisting of surfactants, sequestering agents, and anti-corrosive agents.

6. The etching composition of claim 1, wherein the etching composition is used for etching of a nitride film.

7. A method for fabricating a semiconductor device, the method comprising an etching process that is carried out using the etching composition of claim 1.

8. The method of claim 7, wherein the etching process comprises etching a nitride film.

9. The method of claim 8, wherein the etching process comprises selectively etching the nitride film with respect to an oxide film.

10. The method of claim 8, wherein the nitride film comprises a silicon nitride film.

11. The method of claim 8, wherein the etching process is carried out at a temperature between 50 and 300° C.

12. The method of claim 7, wherein the method comprises a wet-etching process that is carried out using the etching composition in a device isolation process for the semiconductor device.

13. The method of claim 12, wherein the method comprises:
forming a nitride film on a substrate;
forming a trench in the substrate using the nitride film as a hard mask;
forming an oxide film so as to fill the trench;
performing a chemical mechanical polishing process using the nitride film as a polishing stop film until the nitride film is exposed; and
removing the nitride film by a wet-etching process using the etching composition.

14. The method of claim 7, wherein the method comprises a wet-etching process which is carried out using the etching composition in a process for forming a channel for a flash memory device.

15. The method of claim 14, wherein the method comprises:
forming on a substrate a pipe gate electrode film in which a first nitride film for forming a pipe channel is buried;
forming on the resulting substrate a cell gate structure consisting of an alternating stack of a first interlayer insulating film and a first gate electrode film;
selectively etching the cell gate structure to form a pair of first and second holes so as to expose the first nitride film, and forming a second nitride film filling the first and second holes;

selectively etching the cell gate structure to form a trench that isolates the first gate electrode film into portions corresponding to the first and second holes, respectively;

forming on the resulting structure having the trench formed therein a selection gate structure comprising a second interlayer insulating film for forming a selection transistor and a second gate electrode film;

selectively etching the selection gate structure to form third and fourth holes exposing the second nitride film filled in the pair of first and second holes; and performing a wet-etching process using the etching composition to remove the second nitride film exposed through the third and fourth holes, and the first nitride film below the second nitride film.

16. The method of claim 7, wherein the method comprises a wet-etching process which is carried out using the etching composition in a process for forming a diode for a phase-change memory device.

17. The method of claim 16, wherein the method comprises:

providing on a substrate an insulating structure having holes exposing a conductive region;

forming in the holes diodes coming into contact with the conductive region;

sequentially forming a titanium silicide film, a titanium nitride film and a nitride film on each diode;

performing a dry-etching process to form an oxide film in an isolated space between the diodes, followed by a chemical mechanical polishing process;

performing a wet-etching process using the etching composition to remove the nitride film; and depositing titanium in spaces remaining after removal of the nitride film to form bottom electrodes.

* * * * *